US010103081B2

United States Patent
Bharadwaj

(10) Patent No.: US 10,103,081 B2
(45) Date of Patent: Oct. 16, 2018

(54) HEAT SINK

(71) Applicant: Ashwin Bharadwaj, Bangalore (IN)

(72) Inventor: Ashwin Bharadwaj, Bangalore (IN)

(73) Assignee: Ashwin Bharadwaj (IN)

( * ) Notice: Subject to any disclaimer, the term of this patent is extended or adjusted under 35 U.S.C. 154(b) by 391 days.

(21) Appl. No.: 14/479,375

(22) Filed: Sep. 8, 2014

(65) Prior Publication Data

US 2016/0070319 A1    Mar. 10, 2016

(51) Int. Cl.
| | | |
|---|---|---|
| *F28F 7/00* | (2006.01) | |
| *H01L 23/34* | (2006.01) | |
| *H01L 23/367* | (2006.01) | |
| *H01L 23/467* | (2006.01) | |
| *H01L 21/48* | (2006.01) | |

(52) U.S. Cl.
CPC .......... *H01L 23/34* (2013.01); *H01L 23/3672* (2013.01); *H01L 23/467* (2013.01); *H01L 21/4882* (2013.01); *H01L 2924/0002* (2013.01)

(58) Field of Classification Search
CPC ... H01L 23/467; H01L 23/3672; F28D 7/103; F28D 7/10; F28D 7/12
USPC ................................................ 165/80.3, 184
See application file for complete search history.

(56) References Cited

U.S. PATENT DOCUMENTS

| | | | | |
|---|---|---|---|---|
| 1,303,107 A | * | 5/1919 | Oderman | F28D 3/02 165/117 |
| 2,712,520 A | * | 7/1955 | Nester | B01D 3/30 159/6.2 |
| 2,869,836 A | * | 1/1959 | Huet | F28F 1/22 165/165 |
| 2,870,999 A | * | 1/1959 | Soderstrom | B21C 37/26 165/156 |
| 2,895,508 A | * | 7/1959 | Drake | F28F 1/40 138/38 |
| 3,027,314 A | * | 3/1962 | Vaughan | C02F 11/00 165/184 |
| 3,239,003 A | * | 3/1966 | Boudette | B21D 53/02 165/185 |
| 3,265,115 A | * | 8/1966 | Maier | B01D 1/065 159/13.2 |
| 3,372,095 A | * | 3/1968 | Nester | B01D 3/10 159/6.2 |

(Continued)

FOREIGN PATENT DOCUMENTS

WO    WO 03065775 A2 * 8/2003 ........... H01L 23/467

OTHER PUBLICATIONS

Chung, Materials for thermal conduction, Mar. 15, 2000, p. 2, table 1.*

*Primary Examiner* — Claire Rojohn, III

(57) ABSTRACT

A heat sink (100) for an electronic device comprising a first plate (102), a second plate (104) and a pipe (106). One side of the first plate (102) is in thermal contact with the electronic device. The second plate (104) is in thermal contact with the other side of the first plate (102). Further, the second plate (104) includes a hole and placed such that, a gap for airflow maintained between the first plate (102) and the second plate (104). One end the pipe (106) thermally coupled to the second plate (104). Thus facilitating the air flowing into the pipe (106) through the other end escapes the heat sink through the gap maintained between the first plate (102) and the second plate (104) via the hole on the second plate (104).

16 Claims, 10 Drawing Sheets

(56) References Cited

U.S. PATENT DOCUMENTS

| | | | | |
|---|---|---|---|---|
| 3,633,343 A * | 1/1972 | Mark | F01N 3/0217 | 55/323 |
| 3,636,982 A * | 1/1972 | Drake | F28F 1/40 | 138/38 |
| 3,956,072 A * | 5/1976 | Huse | B01D 1/289 | 159/24.1 |
| 3,983,861 A * | 10/1976 | Beauchaine | F24S 10/70 | 126/656 |
| 4,090,559 A * | 5/1978 | Megerlin | F28F 1/40 | 138/38 |
| 4,190,105 A * | 2/1980 | Dankowski | B60H 1/3227 | 138/38 |
| 4,325,781 A * | 4/1982 | Proske | B01D 1/10 | 159/13.2 |
| 4,534,409 A * | 8/1985 | Cadars | F28F 13/12 | 138/38 |
| 4,784,218 A * | 11/1988 | Holl | F28F 13/02 | 138/38 |
| 5,132,780 A * | 7/1992 | Higgins, III | H01L 23/467 | 165/104.34 |
| 5,361,188 A * | 11/1994 | Kondou | H01L 23/467 | 165/104.34 |
| 5,454,429 A * | 10/1995 | Neurauter | F28D 7/16 | 138/38 |
| 5,782,292 A * | 7/1998 | Ogawara | H01L 23/467 | 165/122 |
| 5,787,976 A * | 8/1998 | Hamburgen | F28F 3/02 | 165/185 |
| 6,092,589 A * | 7/2000 | Filius | F25B 39/02 | 138/38 |
| 6,219,242 B1 * | 4/2001 | Martinez | H05K 7/20154 | 165/121 |
| 6,288,895 B1 * | 9/2001 | Bhatia | G06F 1/203 | 165/104.33 |
| 6,561,261 B2 * | 5/2003 | Wagner | H01L 23/467 | 165/121 |
| 6,702,002 B2 * | 3/2004 | Wang | H01L 23/367 | 165/104.33 |
| 6,816,374 B2 * | 11/2004 | Patel | G06F 1/20 | 165/121 |
| 6,827,138 B1 * | 12/2004 | Master | F28D 7/1607 | 165/159 |
| 6,845,010 B2 * | 1/2005 | Lee | H01L 23/3672 | 165/104.33 |
| 7,055,577 B2 * | 6/2006 | Wang | H01L 23/467 | 165/185 |
| 7,108,139 B2 * | 9/2006 | Nguyen | B01D 27/06 | 210/437 |
| 7,142,422 B2 * | 11/2006 | Lee | H01L 23/4006 | 165/104.33 |
| 7,269,013 B2 * | 9/2007 | Chen | H01L 23/4006 | 165/104.19 |
| 7,584,780 B1 * | 9/2009 | Lemont | H01L 23/467 | 165/125 |
| 7,785,448 B2 * | 8/2010 | Owens | B01D 1/06 | 203/10 |
| 7,929,302 B2 * | 4/2011 | Chuang | G06F 1/20 | 165/121 |
| 8,196,643 B2 * | 6/2012 | Chen | H01L 21/4878 | 165/128 |
| 8,256,258 B2 * | 9/2012 | Yamaoka | B21C 23/08 | 29/890.03 |
| 8,354,779 B2 * | 1/2013 | Falicoff | F21K 9/00 | 313/35 |
| 9,005,393 B2 * | 4/2015 | Owens | B01D 1/06 | 15/398 |
| 9,782,702 B2 * | 10/2017 | Carrion | B01D 29/56 | |
| 2002/0038699 A1 * | 4/2002 | Wagner | H01L 23/467 | 165/80.3 |
| 2003/0102110 A1 * | 6/2003 | Wagner | F28F 1/105 | 165/80.3 |
| 2003/0189813 A1 * | 10/2003 | Lee | H01L 23/3672 | 361/704 |
| 2005/0145366 A1 * | 7/2005 | Erel | H01L 23/467 | 165/80.3 |
| 2005/0257914 A1 * | 11/2005 | Huang | H01L 23/3672 | 165/80.3 |
| 2006/0086484 A1 * | 4/2006 | Hegde | F28D 15/0275 | 165/104.33 |
| 2006/0196636 A1 * | 9/2006 | Liu | H01L 23/467 | 165/80.3 |
| 2007/0023163 A1 * | 2/2007 | Kidwell | F24J 3/084 | 165/45 |
| 2007/0159798 A1 * | 7/2007 | Chen | H01L 23/4006 | 361/700 |
| 2008/0029243 A1 * | 2/2008 | O'Donnell | F24H 3/087 | 165/48.1 |
| 2008/0035315 A1 * | 2/2008 | Han | F04D 17/04 | 165/121 |
| 2008/0120981 A1 * | 5/2008 | Dean | F04F 7/00 | 62/6 |
| 2009/0000327 A1 * | 1/2009 | Burk | F25B 17/086 | 62/324.6 |
| 2009/0211729 A1 * | 8/2009 | Wang | H01L 23/467 | 165/80.3 |
| 2010/0177480 A1 * | 7/2010 | Koplow | F04D 25/0606 | 361/697 |
| 2011/0103011 A1 * | 5/2011 | Koplow | F04D 25/0606 | 361/679.54 |
| 2013/0039072 A1 * | 2/2013 | Kim | F21V 29/006 | 362/294 |
| 2013/0167570 A1 * | 7/2013 | Bouloy | F25B 39/02 | 62/156 |
| 2013/0175017 A1 * | 7/2013 | Goto | B21D 11/14 | 165/181 |
| 2014/0127091 A1 * | 5/2014 | Wang | F28F 1/40 | 422/198 |
| 2014/0190668 A1 * | 7/2014 | Joshi | H01L 23/4735 | 165/104.33 |
| 2015/0000876 A1 * | 1/2015 | Yang | F28D 15/00 | 165/104.31 |
| 2015/0159957 A1 * | 6/2015 | Baxi | F25B 40/00 | 165/109.1 |
| 2016/0047541 A1 * | 2/2016 | Jones | F24D 5/08 | 126/91 A |
| 2016/0053653 A1 * | 2/2016 | Han | F01N 5/025 | 62/3.3 |
| 2016/0131040 A1 * | 5/2016 | Agg | F02C 7/224 | 60/785 |
| 2016/0363379 A1 * | 12/2016 | Strecker | F28D 7/12 | |

* cited by examiner

HEAT SINK

BACKGROUND

Field of the Subject Matter

The subject matter relates to the field of heat sinks, more particularly but not exclusively, to heat sinks used for integrated circuits.

Discussion of Related Field

Electronic devices, such as, personal computer and laptops, among others, use one or more microprocessors. These microprocessors while operating at higher speeds generate heat. The heat generated can damage the microprocessor and other components associated with it. Therefore, heat sink, which is a type of heat exchanger, is used to overcome this problem.

Heat sinks are used to conduct the heat generated by the microprocessor and dissipate it into the environment, thereby allowing safe operation of the microprocessor. Heat sinks are generally categorized into two, namely, active heat sinks and passive heat sinks.

Passive heat sinks are metal fixtures associated with the microprocessor to increase the surface area of the conducting metal and dissipate heat into the environment. However, case of higher speed processors, which dissipates more heat, a much bigger passive heat sink is required for efficient operation of the microprocessor and to prevent it from physical damage. This requires constant increase in size of the heat sinks with ever-increasing speeds of the microprocessors, thereby increasing overall size of the electronic device, which includes such microprocessors.

Active heat sinks may be used to overcome the problem associated with size of the passive heat sinks. The active heat sinks include a fan to cool the metal fixtures. Incorporating a fan will overcome the problem of size. However, for efficient cooling of the heat sink, the air blown by the fan has to be directed, such that, it passes through the maximum possible surface area of the heat sink. Further, there should be a proper design for the air to exit the heat sink.

In light of the foregoing discussion, there is a need for a technique to implement a heat sink with improved efficiency.

STATEMENT OF INVENTION

Accordingly, the invention provides a heat sink including a first plate, a second plate and a pipe. One side of the first plate is in thermal contact with the electronic device. The second plate is in thermal contact with the other side of the first plate. Further, the second plate includes a hole and placed such that, a gap for airflow is maintained between the first plate and the second plate. One end the pipe is thermally coupled to the second plate. Thus facilitating the air flowing into the pipe through the other end escapes the heat sink through the gap maintained between the first plate and the second plate via the hole on the second plate.

BRIEF DESCRIPTION OF DRAWINGS

Embodiments are illustrated by way of example and not limitation the Figures of the accompanying drawings, in which like references indicate similar elements and in which.

DETAILED DESCRIPTION OF THE PREFERRED EMBODIMENTS

I. Overview
II. Exemplary Diagrams
III. Conclusion

I. OVERVIEW

The subject matter relates to the field of heat sinks, more particularly but not exclusively, to heat sinks used for integrated circuits.

Embodiments disclose an improved heat sink for efficient cooling of integrated circuits.

The improved heat sink includes a first plate, a second plate, and a pipe coupled to the first plate and the second plate. One side of the first plate is in thermal contact with an electronic device. The second plate is in thermal contact with the first plate. The second plate is placed on other side of the first plate, such that, a gap for airflow is maintained between the first plate and the second plate.

The following detailed description includes references to the accompanying drawings, which form a part of the detailed description. The drawings show illustrations in accordance with example embodiments. These example embodiments, which are herein also referred to as "examples" are described in enough detail to enable those skilled in the art to practice the present subject matter. The embodiments can be combined, other embodiments can be utilized, or structural, logical, and design changes can be made without departing from the scope of the claims. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive "or," such that "A or B" includes "A hut not B," "B but not A," and "A and B," unless otherwise indicated.

II. EXEMPLARY DIAGRAMS

Figure 1:
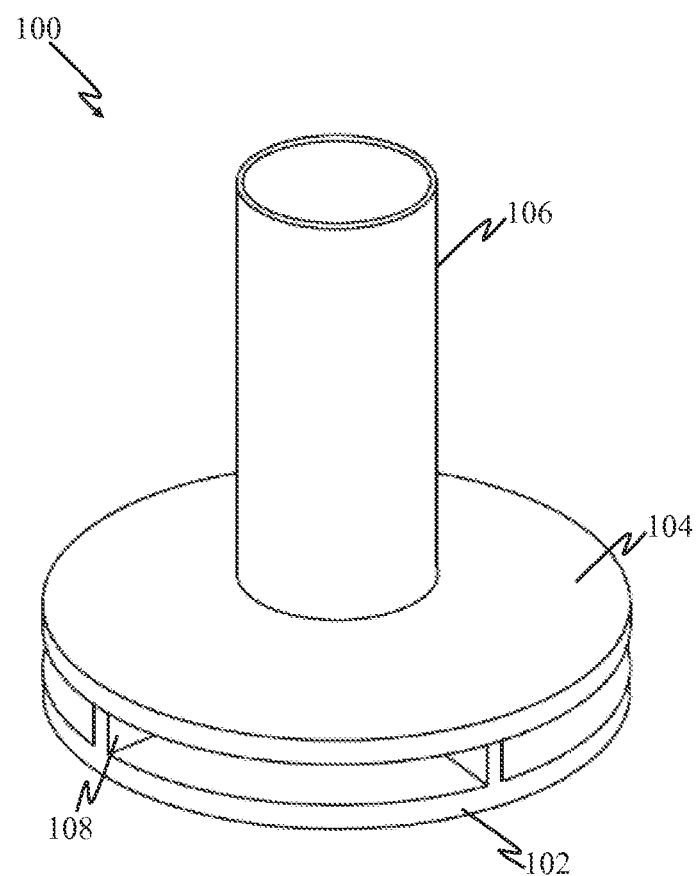
FIG. 1 illustrates an example heat sink 100, in accordance with an embodiment.

FIG. 1 illustrates an example heat sink 100, in accordance with an embodiment. The heat sink 100 includes a first plate 102, a second plate 104 and a pipe 106. One side of the first plate 102 is in thermal contact with an electronic device, such that, it can absorb the heat from the electronic device.

The second plate 104 is in thermal contact with the first plate 102. Further, the second plate 104 is placed on other side of the first plate 102, such that, a gap for airflow is maintained between the first plate 102 and the second plate 104.

In an embodiment, the gap between the first plate 102 and the second plate 104 is maintained by using one or more wall sections 108 as indicated in the FIG. 1.

In an embodiment, the first plate 102 and the second plate 104 are good conductors of heat and can be made of one or more metals, such as, but not limited to, aluminum, copper, and aluminum alloy.

In an embodiment, thermally coupled means, the two or more sections are in physical contact with each other and are capable of exchanging heat.

In an embodiment, two sections are said to be in thermal contact with each other, if they are capable of exchanging heat even without a physical contact.

In an embodiment, an electronic device can be any integrated circuit, not limiting to, microprocessor and graphic processor.

The pipe 106 is thermally coupled to the second plate 104. Further, the ends on either side of the pipe 106 are open.

Figure 2:
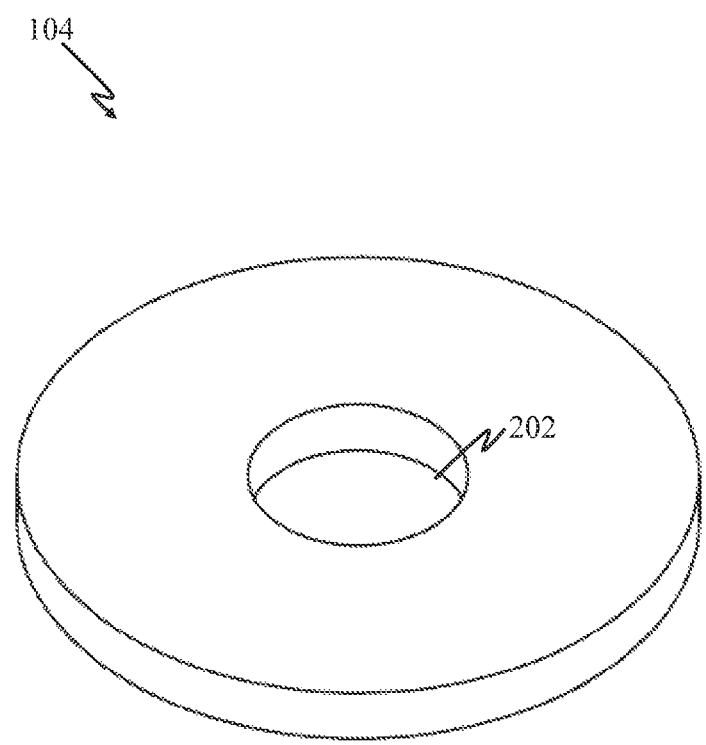
FIG. 2 illustrates an example isometric view of a second plate 104, in accordance with an embodiment.

FIG. 2 illustrates an example isometric view of the second plate 104, in accordance with an embodiment. The second plate 104 includes a hole 202. One end of the pipe 106 is coupled to the second plate, such that, the air entering through the other end of the pipe 106 escapes via the hole 202 through the gap maintained between the first plate 102 and the second plate 104.

In an embodiment, the air is directed into the heat sink 100 by placing a fan on top of the heat sink 100.

In an embodiment, the pipe 106 can be internally divided into two or more sections along the axis of the pipe 106 to increase the surface area of the heat sink 100.

Figure 3:
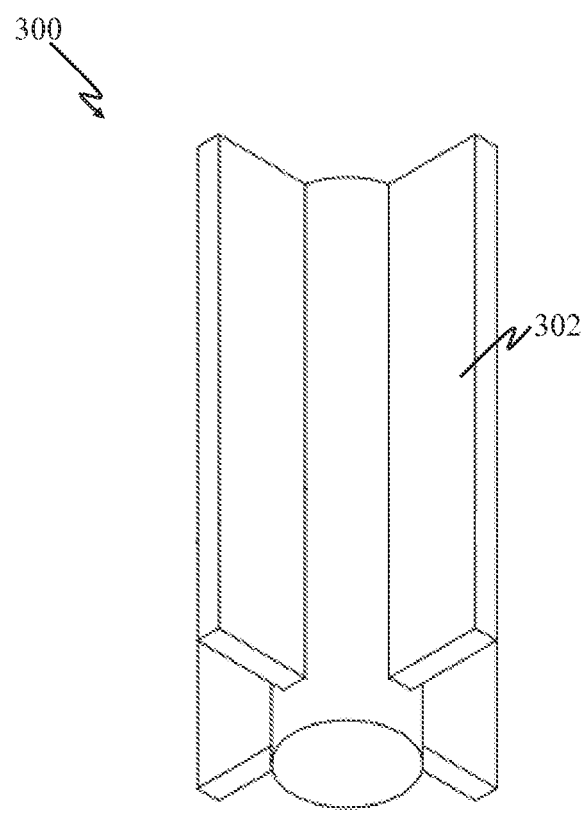
FIG. 3 illustrates an example isometric view of a supporting section 300, in accordance with an embodiment.

FIG. 3 illustrates an example isometric view of a supporting section 300, in accordance with an embodiment. The supporting section 300 is thermally coupled to the first plate 102, the second plate 104 and the pipe 106. The supporting section 300 is placed inside the pipe 106 extending from the other end of the pipe 106 till the hole 502 on the first plate 102, where it may be coupled to the first plate 102. The supporting section 300 can include partitioning walls 302 along the axis of the pipe 106.

Figure 4:
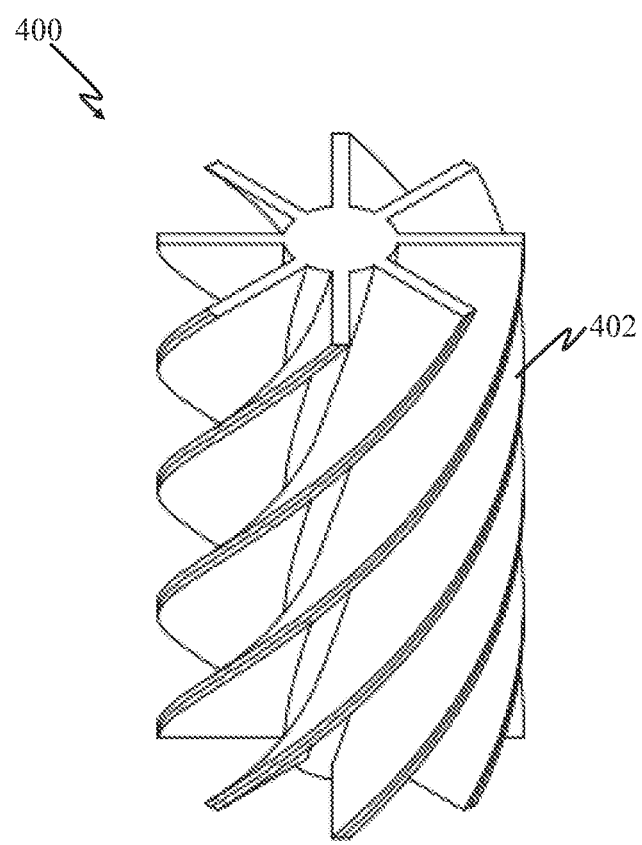
FIG. 4 illustrates an example isometric view of another type of supporting section 400, in accordance with an embodiment.

FIG. 4 illustrates an example isometric view of another type of supporting section 400, in accordance with an embodiment. The supporting section 400 is placed inside the pipe 106 and the supporting section 400 can include partitioning walls 402 to increase the surface area of the heat sink.

Figure 5:
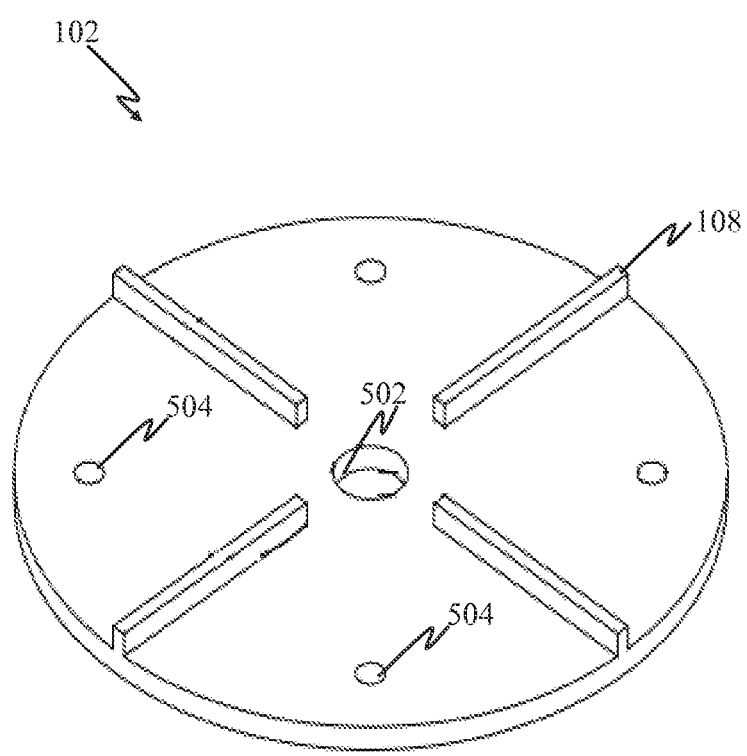
FIG. 5 illustrates an example isometric view of a first plate 102 compatible with supporting section 300, in accordance with an embodiment.

FIG. 5 illustrates an example isometric view of the first plate 102 compatible with supporting section 300, in accordance with an embodiment. The first plate 102 can include one or more wall sections 108 and a hole 502 to accommodate one end of the supporting section 300. Further, the first plate 102 can also include one or more holes 504 to fix the heat sink 100 on top of the electronic device.

Figure 6:
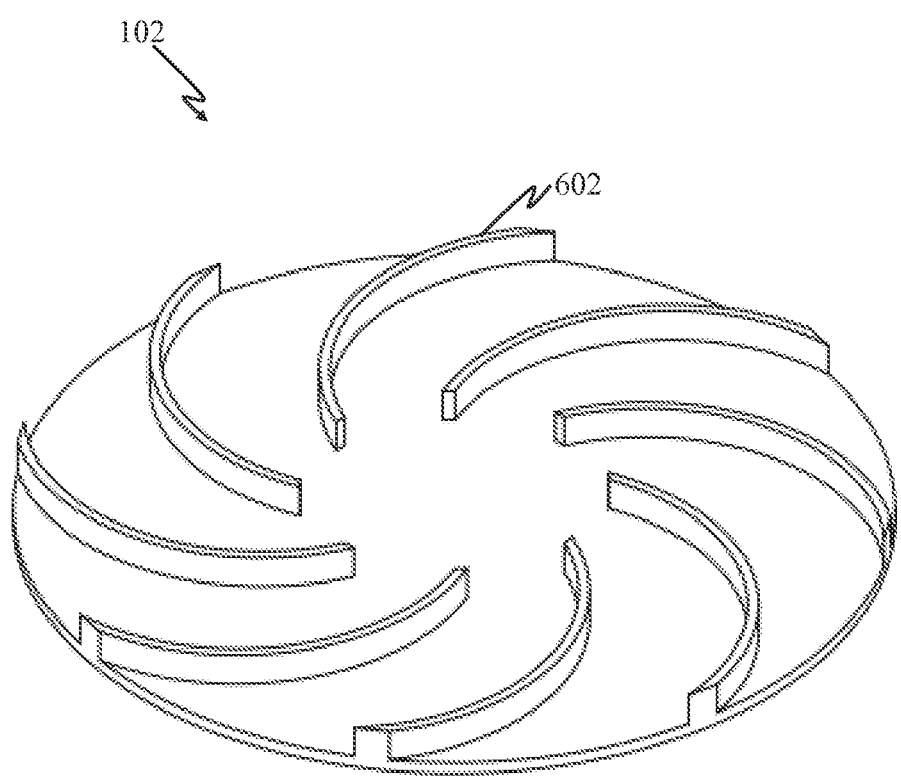
FIG. 6 illustrates an example isometric view of another type of first plate 102 compatible with supporting section 400, in accordance with an embodiment.

FIG. 6 illustrates an example isometric view of another type of first plate 102 compatible with supporting section 400, in accordance with an embodiment. The first plate can include one or more wall sections 602 to support the supporting section 400, in accordance with an embodiment.

Figure 7:
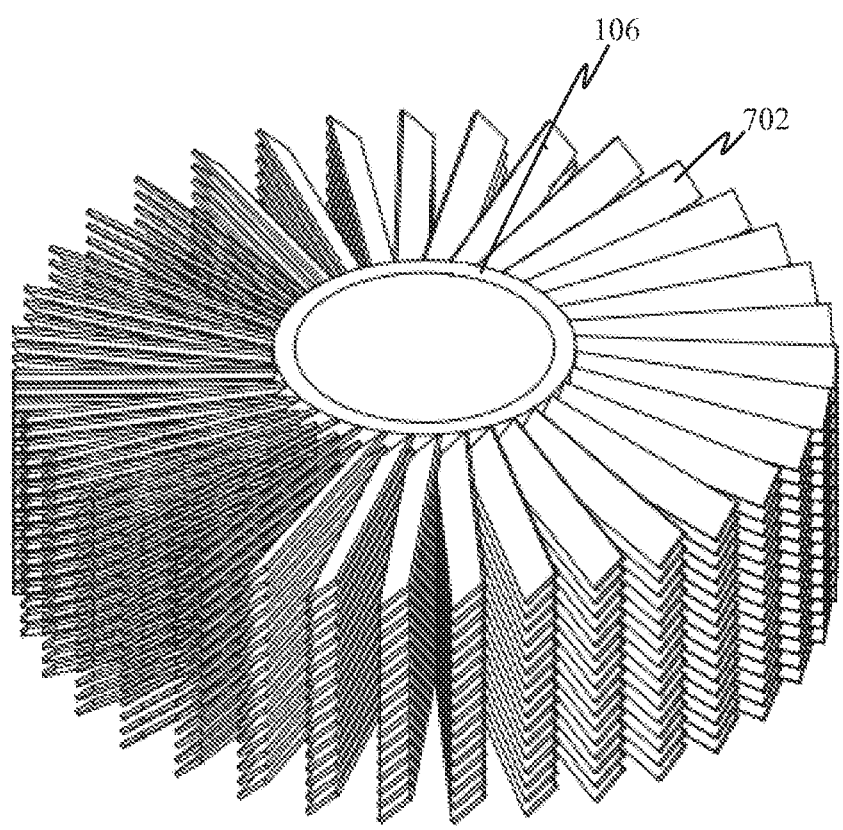
FIG. 7 illustrates an example isometric view of a pipe 106 with a plurality of fins 702, in accordance with an embodiment.

FIG. 7 illustrates an example isometric view of the pipe 106 with a plurality of fins 702, in accordance with an embodiment. A plurality of fins 702, are externally coupled or brazed to the pipe 106. The fins 702 are brazed at an angle in the direction of rotation of the fan, placed over the heat sink 100. The angle is chosen such that, maximum air flows through the plurality of fins 702, thereby maximizing efficiency of the heat sink 100. The preferred angle of the fins 702 is 45 degrees in the direction of rotation of rotation of fan.

Figure 8:
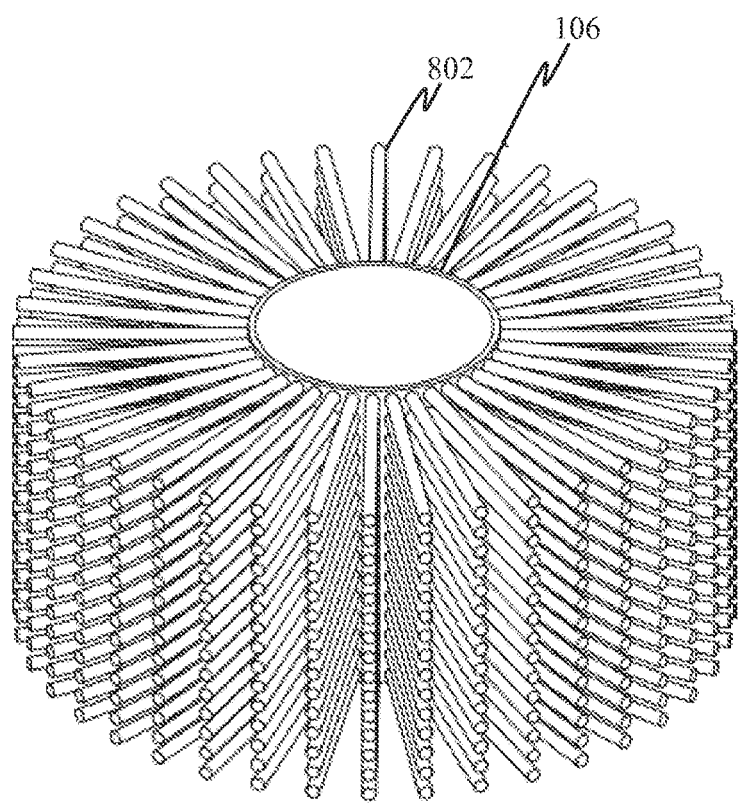
FIG. 8 illustrates an example isometric view of the pipe 106 with a plurality of horizontal poles 802, in accordance with an embodiment.

FIG. 8 illustrates an example isometric view of the pipe 106 with a plurality of horizontal poles 802, in accordance with an embodiment. A plurality of horizontal poles 802 are externally coupled or brazed to the pipe 106.

Figure 9:
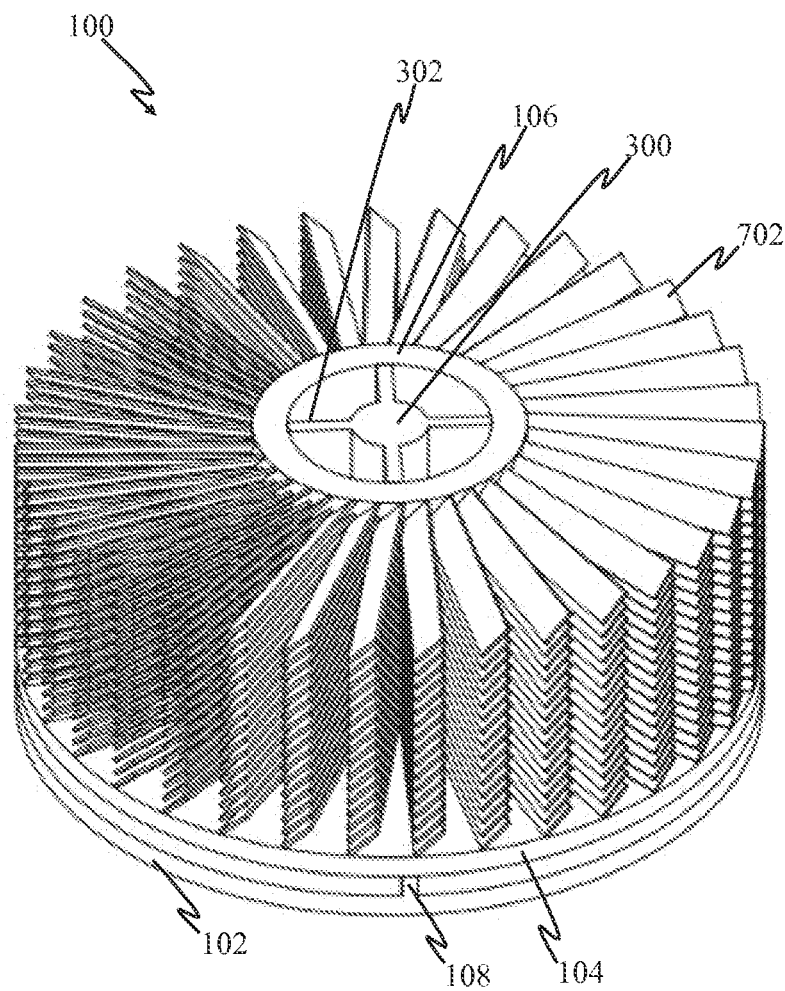
FIG. 9 illustrates an example isometric view of the heat sink 100 with the supporting section 300 and the pipe 106 with a plurality of fins 702, in accordance with an embodiment.

FIG. 9 illustrates an example isometric view of the heat sink 100 with the supporting section 300 and the pipe 106 with a plurality of fins 702, in accordance with an embodiment. When a fan is placed over the heat sink 100, air flows through the vertical sections inside the pipe 106 and exits through the gap between the first plate 102 and the second plate 104. Further, the air focused on the exterior of the pipe 106 flows through the fins 702. The angle of the fins 702 is such that, the air flow is directed towards substantial number of fins 702, thus directing the air through maximum possible surface area.

Figure 10A:
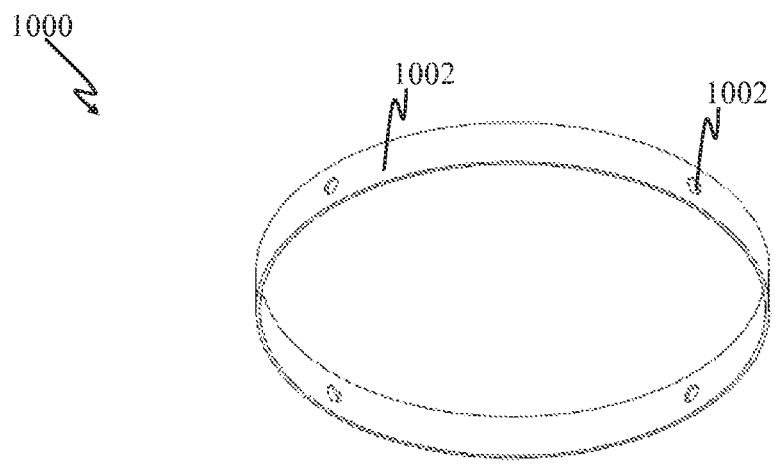
FIG. 10a illustrates an example isometric view of a ring 1000 covering the space between the first plate 102 and second plate 104, and allowing the air to exit through holes 1002, in accordance with an embodiment.

FIG. 10a illustrates an example isometric view of a ring 1000 covering the space between the first plate 102 and second plate 104, and allowing the air to exit through the holes 1002, in accordance with an embodiment. The ring 1000 is used to limit the airflow, through the gap between the first plate 102 and the second plate 104. The ring 1000 allows the air entering the pipe 106 to exit through the holes 1002. Thus, the air is forced to stay inside the pipe and between the plates 102 and 104 for a longer duration.

Figure 10B:
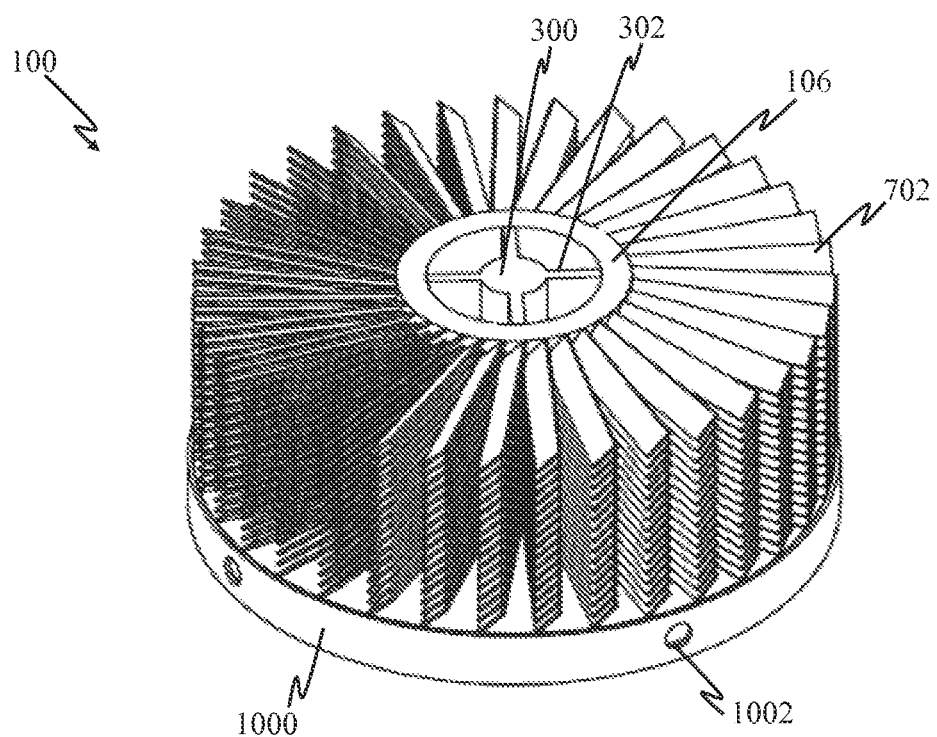
FIG. 10b illustrates an example isometric view of a heat sink 100 with the ring 1000, in accordance with an embodiment.

FIG. 10b illustrates an example isometric view of a heat sink 100 with the ring 1000, in accordance with an embodiment. In an embodiment, the ring 1000 is brazed or coupled, to the outer surface of the first plate 102 and the second plate 104. Further the holes 1002 provided in the ring 1000 allows the air entering the pipe 106 to limit the airflow. Thus, the air is forced to stay inside e heat sink 100 for a longer duration.

In an embodiment, the pipe 106, the supporting section 300, the supporting section 400 the fins 702, the horizontal poles 802, the wall section 108 the wall section 602, the ring 1000, the partitioning walls 302, and the partitioning walls 402 are good conductors of heat, and can be made of one or more metals, such as, but not limited to, aluminum, copper and aluminum alloy.

III. CONCLUSION

The aforementioned heat sink achieves considerable efficiency by efficiently directing air through the heat sink. The fins or the horizontal poles, which are coupled to the pipe improves the surface area of the heat sink, thereby further enhancing the efficiency of the heat sink.

Although, embodiments have been described with reference to specific example embodiments, it will be evident that various modifications, arrangements of components and changes may be made to these embodiments without departing from the broader spirit and scope of the heat sink described herein. Accordingly, the specification and drawings are to be regarded in an illustrative rather than a restrictive sense.

Many alterations and modifications of the present invention will no doubt become apparent to a person of ordinary skill in the art after having read the foregoing description. It is to be understood that the phraseology or terminology employed herein is for the purpose of description and not of limitation. It is to be understood that the description above contains many specifications, these should not be construed as limiting the scope of the invention but as merely providing illustrations of some of the personally preferred embodiments of this invention. Thus the scope of the invention should be determined by the appended claims and their legal equivalents rather than by the examples given.

What is claimed is:

1. A heat sink comprising:
   a first plate, wherein one side of the first plate is in thermal contact with an electronic device;
   a second plate in thermal contact with the first plate, wherein the second plate includes a hole and placed on other side of the first plate, such that, a gap for airflow is maintained between the first plate and the second plate;
   a pipe whose one end is thermally coupled to the second plate, such that, air flowing into the pipe through other end of the pipe escapes the heat sink through the gap maintained between the first plate and the second plate via the hole; and
   a supporting section, which is stationary, the supporting section comprising an elongated member and a plurality of partition walls, the partition walls extending from the elongated member and in physical contact with an inner surface of the pipe to thermally couple the supporting section to the pipe, while defining at least a first passage and a second passage for air between the elongated member, partition walls and the inner surface of the pipe, the partition walls extending till the second plate and terminating at the second plate, and the elongated member extending till the first plate to be in physical contact with the first plate, wherein the supporting section is inside the pipe, such that:
      air enters the first passage at the other end of the pipe, and escapes the pipe and the first passage at the one end of the pipe; and
      air enters the second passage at the other end of the pipe, and escapes the pipe and the second passage at the one end of the pipe;
   wherein the supporting section extends from the other end of the pipe till the first plate, while passing through the hole of the second plate, while allowing the air flowing into the pipe through the other end of the pipe escape the heat sink through the gap maintained between the first plate and the second plate, wherein the elongated member is a solid cylindrical rod.

2. The heat sink according to claim 1, further comprising a plurality of fins externally coupled to the pipe.

3. The heat sink according to the claim 2, wherein the plurality of fins are at an angle in a direction of rotation of a fan, wherein the angle is in the range of 30 degrees to 60 degrees.

4. The heat sink according to the claim 2, wherein the fins are made of, at least one of, aluminum, copper and aluminum alloy.

5. The heat sink according to claim 1, further comprising a plurality of horizontal poles externally coupled to the pipe.

6. The heat sink according to claim 1, wherein the pipe's internal volume is divided into two or more sections along an axis of the pipe.

7. The heat sink according to claim 1, wherein the first plate comprises a hole.

8. The heat sink according to the claim 1, wherein the supporting section is made of, at least one of, aluminum, copper and aluminum alloy.

9. The heat sink according to claim 1, wherein the supporting section is along an axis of the pipe.

10. The heat sink according to the claim 1, wherein the partitioning walls are made of at least one of aluminum, copper and aluminum alloy.

11. The heat sink according to claim 1, wherein at least one of the first plate and the second plate are separated by wall sections to maintain the gap for the airflow between the first plate and the second plate.

12. The heat sink according to the claim 1, wherein at least one of the first plate, the second plate and the pipe, is made of, at least one of, aluminum, copper and aluminum alloy.

13. The heat sink according to the claim 1, further comprising a ring with at least one hole, wherein the ring is configured to limit the airflow through the gap between the first plate and the second plate.

14. The heat sink according to the claim 13, wherein the ring is made of at least one of aluminum, copper and aluminum alloy.

15. The heat sink according to claim 1, wherein the partitioning walls are straight in shape.

16. The heat sink according to the claim 1, wherein the partitioning walls are spiral.

* * * * *